(12) United States Patent
Kim

(10) Patent No.: US 8,736,352 B2
(45) Date of Patent: May 27, 2014

(54) INTERNAL VOLTAGE GENERATION CIRCUIT

(75) Inventor: Jae Hoon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 13/485,318

(22) Filed: May 31, 2012

(65) Prior Publication Data

US 2013/0169353 A1 Jul. 4, 2013

(30) Foreign Application Priority Data

Dec. 28, 2011 (KR) .................. 10-2011-0145224

(51) Int. Cl.
*G05F 1/46* (2006.01)
(52) U.S. Cl.
USPC .............................. 327/536; 327/538; 363/59
(58) Field of Classification Search
None
See application file for complete search history.

(56) References Cited

U.S. PATENT DOCUMENTS

| | | | |
|---|---|---|---|
| 6,654,296 B2 * | 11/2003 | Jang et al. | ............... 365/189.09 |
| 6,741,118 B2 | 5/2004 | Uchikoba et al. | |
| 2008/0018384 A1 * | 1/2008 | Kim et al. | ..................... 327/536 |

FOREIGN PATENT DOCUMENTS

KR 1020110067506 A 6/2011

* cited by examiner

*Primary Examiner* — Lincoln Donovan
*Assistant Examiner* — Terry L Englund
(74) *Attorney, Agent, or Firm* — William Park & Associates Patent Ltd.

(57) ABSTRACT

An internal voltage generation circuit includes a pumping voltage generation unit configured to generate a pumping voltage when a first internal voltage has a lower level than a first reference voltage or a second internal voltage has a lower level than a second reference voltage, and a select transmission unit configured to selectively transmit the pumping voltage as the first internal voltage or the second internal voltage.

15 Claims, 4 Drawing Sheets

INTERNAL VOLTAGE GENERATION CIRCUIT

CROSS-REFERENCES TO RELATED APPLICATIONS

The present application claims priority under 35 U.S.C 119(a) to Korean Application No. 10-2011-0145224, filed on Dec. 28, 2011, in the Korean intellectual property Office, which is incorporated herein by reference in its entirety as set forth in full.

BACKGROUND

Typically, a semiconductor memory device receives a power supply voltage VDD and a ground voltage VSS from a source outside the semiconductor memory device, and the semiconductor memory device generates and uses internal voltages required for internal operations. The internal voltages required for internal operations of the semiconductor memory device include a core voltage VCORE supplied to a memory core area, a boost voltage VPP used for driving a word line or during overdriving, and a back bias voltage VBB supplied as a bulk voltage to an NMOS transistor in the core area.

The core voltage VCORE may be supplied by reducing the power supply voltage VDD to a predetermined level. The boost voltage VPP has a higher level than the power supply voltage VDD, and the back bias voltage VBB maintains a lower level than the ground voltage VSS inputted from outside. Therefore, a voltage pump is required to perform a pumping operation for supplying charges for the boost voltage VPP and the back bias voltage VBB.

FIG. 1 is a block diagram illustrating a configuration of a conventional internal voltage generation circuit.

Referring to FIG. 1, the conventional internal voltage generation circuit includes a detector 11, an oscillator 12, and a voltage pump 13. The detector 11 is configured to generate a detection signal DET which is enabled to a logic high level when an internal voltage VINT has a lower level than a reference voltage VREF. The oscillator 12 is configured to generate an oscillation signal OSC as a periodic signal when the detection signal DET, enabled to a logic high level, is inputted. The voltage pump 13 is configured to pump the internal voltage VINT when the oscillation signal OSC is inputted. The internal voltage generation circuit configured in such a manner is used for generating a boost voltage VPP or a back bias voltage VBB, and implemented as a separate circuit for each internal voltage.

However, when the internal voltage VINT is excessively consumed during operation of a semiconductor memory device, the level of the internal voltage VINT may be decreased to cause an operation error. Therefore, when consumption of the internal voltage VINT is large, the conventional internal voltage generation circuit increases the drivability for driving the internal voltage VINT by reducing a cycle of the oscillation signal OSC or increasing the number of voltage pumps. However, when the cycle of the oscillation signal OSC is reduced in a state where the number of voltage pumps is maintained, the pump efficiency decreases, and when the number of voltage pumps is increased, the layout area increases.

SUMMARY

An embodiment of the present invention relates to an internal voltage generation circuit which is capable of pumping a plurality of internal voltages by sharing a voltage pump, thereby improving pumping efficiency and reducing a layout area.

In one embodiment, an internal voltage generation circuit includes: a pumping voltage generation unit configured to generate a pumping voltage when a first internal voltage has a lower level than a first reference voltage or a second internal voltage has a lower level than a second reference voltage; and a select transmission unit configured to selectively transmit the pumping voltage as the first internal voltage or the second internal voltage.

In another embodiment, an internal voltage generation circuit includes: an internal voltage generation unit configured to detect a level of a first internal voltage and pump the first internal voltage; a pumping voltage generation unit configured to generate a pumping voltage when the first internal voltage has a lower level than a first reference voltage or a second internal voltage has a lower level than a second reference voltage; and a select transmission unit configured to selectively transmit the pumping voltage as the first internal voltage or the second internal voltage.

In another embodiment, an internal voltage generation circuit includes: a first pumping voltage generation unit configured to generate a first pumping voltage when a first internal voltage has a lower level than a first reference voltage or a second internal voltage has a lower level than a second reference voltage; a second pumping voltage generation unit configured to generate a second pumping voltage when the first internal voltage has a lower level than the first reference voltage and the second internal voltage has a lower level than the second reference voltage; a first select transmission unit configured to selectively transmit the first pumping voltage as the first internal voltage or the second internal voltage; and a second select transmission unit configured to selectively transmit the second pumping voltage as the first internal voltage or the second internal voltage.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
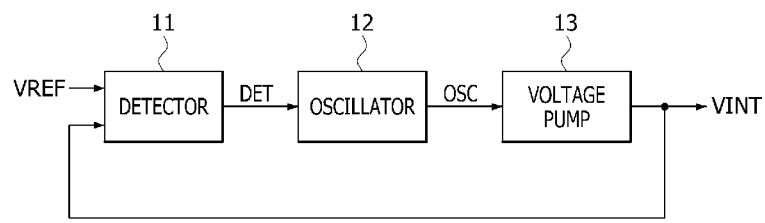
FIG. 1 is a block diagram illustrating the configuration of a conventional internal voltage generation circuit.
Figure 2:
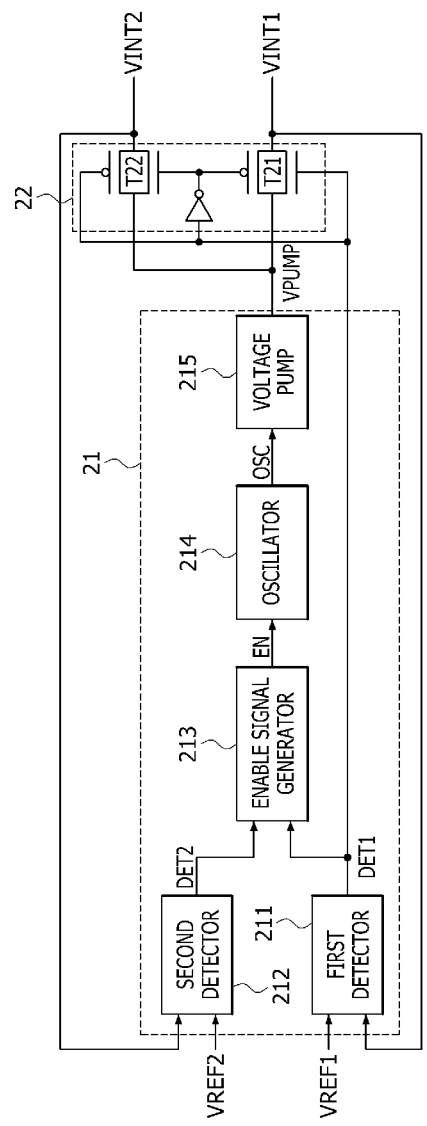
FIG. 2 illustrates a configuration of an internal voltage generation circuit in accordance with an embodiment of the present invention.

Referring to FIG. 2, the internal voltage generation circuit in accordance with an embodiment of the present invention includes a pumping voltage generation unit 21 and a select transmission unit 22. The pumping voltage generation unit 21 includes a first detector 211, a second detector 212, an enable signal generator 213, an oscillator 214, and a voltage pump 215. The first detector 211 is configured to generate a first detection signal DET1 which is enabled to a logic high level when a first internal voltage VINT1 has a lower level than a first reference voltage VREF1. The second detector 212 is configured to generate a second detection signal DET2 which is enabled to a logic high level when a second internal voltage VINT2 has a lower level than a second reference voltage VREF2. The enable signal generator 213 is configured to generate an enable signal EN when at least one of the first and second detection signals DET1 and DET2 is enabled to a logic high level. The oscillator 214 is configured to generate an oscillation signal OSC as a periodic signal when the enable signal EN is enabled to a logic high level. The voltage pump 215 is configured to receive the oscillation signal OSC and pump a pumping voltage VPUMP. The select transmission unit 22 includes a first transmission gate T21 and a second transmission gate T22. The select transmission unit 22 is configured to transmit the pumping voltage VPUMP as the first internal voltage VINT1 through the first transmission gate T21 when the first detection signal DET1 is enabled to a logic high level, and transmit the pump voltage VPUMP as the second internal voltage VINT2 through the second transmission gate T22 when the first detection signal DET1 is disabled to a logic low level.

The operation of the internal voltage generation circuit configured in such a manner may be divided into a case in which the first internal voltage VINT1 has a lower level than the first reference voltage and a case in which the first internal voltage VINT1 has a higher level than the first reference voltage VREF1, and will be described as follows.

First, when the first internal voltage VINT1 has a lower level than the first reference voltage VREF1, the first detector 211 generates the first detection signal DET1 enabled to a logic high level. Accordingly, the enable signal generator 213 generates the enable signal EN enabled to a logic high level, the oscillator 214 generates the oscillation signal OSC, the voltage pump 215 pumps the pumping voltage VPUMP, and the select transmission unit 22 transmits the pumping voltage VPUMP as the first internal voltage VINT1.

Next, when the first internal voltage VINT1 has a higher level than the first reference voltage VREF1, the first detector 211 generates the first detection signal DET1 disabled to a logic low level. In this case, when the second internal voltage VINT2 has a lower level than the second reference voltage VREF2, the second detector 212 generates the second detection signal DET2 enabled to a logic high level. Accordingly, the enable signal generator 213 generates the enable signal EN enabled to a logic high level, the oscillator 214 generates the oscillation signal OSC, the voltage pump 215 pumps the pumping voltage VPUMP, and the select transmission unit 22 transmits the pumping voltage VPUMP as the second internal voltage VINT2.

As described above, the internal voltage generation circuit in accordance with an embodiment of the present invention selectively transmits the pumping voltage VPUMP pumped by the voltage pump 215 as the first internal voltage VINT1 or the second internal voltage VINT2. That is, the internal voltage generation circuit in accordance with an embodiment of the present invention is used for generating the second internal voltage VINT2 as well as the first internal voltage VINT1 using the voltage pump 215. Therefore, when the second internal voltage VINT2 is excessively consumed during operation of a semiconductor memory device, the voltage pump 215 may be shared and used to increase pumping efficiency, and the layout area may be reduced.

Figure 3:
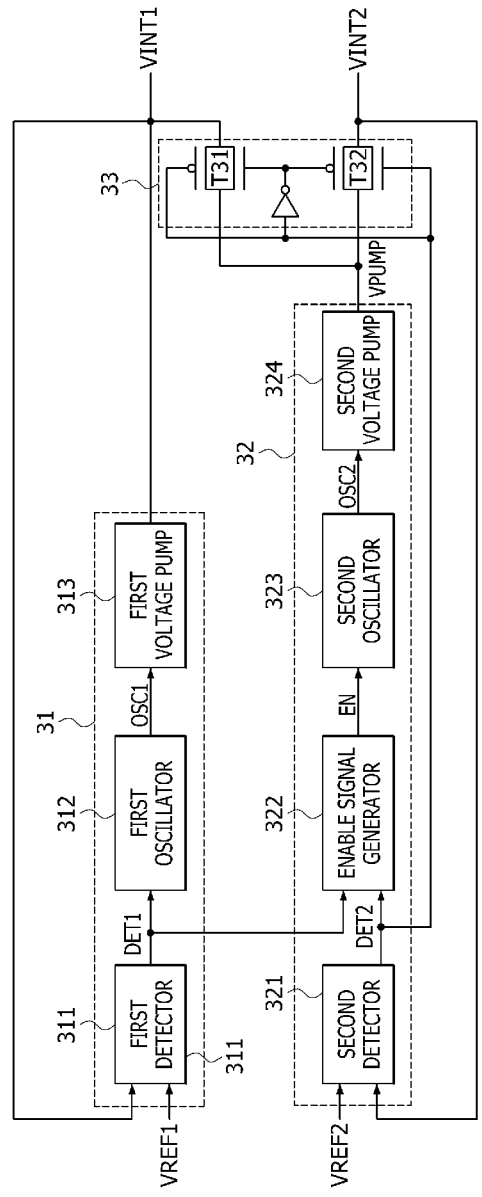
FIG. 3 illustrates a configuration of an internal voltage generation circuit in accordance with another embodiment of the present invention.

FIG. 3 illustrates a configuration of an internal voltage generation circuit in accordance with another embodiment of the present invention.

Referring to FIG. 3, the internal voltage generation circuit includes an internal voltage generation unit 31, a pumping voltage generation unit 32, and a select transmission unit 33. The internal voltage generation unit 31 includes a first detector 311, a first oscillator 312, and a first voltage pump 313. The pumping voltage generation unit 32 includes a second detector 321, an enable signal generator 322, a second oscillator 323, and a second voltage pump 324. The first detector 311 is configured to generate a first detection signal DET1 which is enabled to a logic high level when a first internal voltage VINT1 has a lower level than a first reference voltage VREF1. The first oscillator 312 is configured to generate a first oscillation signal OSC1 as a periodic signal when a first detection signal DET1 enabled to a logic high level is inputted. The first voltage pump 313 is configured to receive the first oscillation signal OSC1 and pump the first internal voltage VINT1. The second detector 321 is configured to generate a second detection signal DET2 which is enabled to a logic high level when a second internal voltage VINT2 has a lower level than a second reference voltage VREF2. The enable signal generator 322 is configured to generate an enable signal EN when at least one of the first and second detection signals DET1 and DET2 is enabled to a logic high level. The second oscillator 323 is configured to generate a second oscillation signal OSC2 as a periodic signal when the enable signal EN is enabled to a logic high level. The second voltage pump 324 is configured to receive the second oscillation signal OSC2 and pump a pumping voltage VPUMP. The select transmission unit 33 includes a first transmission gate T31 and a second transmission gate T32. The select transmission unit 33 is configured to transmit the pumping voltage VPUMP as the second internal voltage VINT2 through the second transmission gate T32 when the second detection signal DET2 is enabled to a logic high level, and transmit the pumping voltage VPUMP as the first internal voltage VINT1 through the first transmission gate T31 when the second detection signal DET2 is disabled to a logic low level.

The operation of the internal voltage generation circuit configured in such a manner may be divided into a case in which the second internal voltage VINT2 has a lower level than the second reference voltage VREF2 and a case in which the second internal voltage VINT2 has a higher level than the second reference voltage VREF2, and will be described as follows.

First, when the second internal voltage VINT2 has a lower level than the second reference voltage VREF2, the second detector 321 generates the second detection signal DET2 enabled to a logic high level. Accordingly, the enable signal generator 322 generates the enable signal EN enabled to a logic high level, the second oscillator 323 generates the second oscillation signal OSC2, the second voltage pump 324 pumps the pumping voltage VPUMP, and the select transmission unit 33 transmits the pumping voltage VPUMP as the second internal voltage VINT2.

Next, when the second internal voltage VINT2 has a higher level than the second voltage VREF2, the second detector 321 generates the second detection signal DET2 disabled to a logic low level. In this case, when the first internal voltage has a lower level than the first reference voltage VREF1, the first detector 311 generates the first detection signal DET1 enabled to a logic high level. Accordingly, the enable signal generator 322 generates the enable signal EN enabled to a logic high level, the second oscillator 323 generates the second oscillation signal OSC2, the second voltage pump 324 pumps the pumping voltage VPUMP, and the select transmission unit 33 transmits the pumping voltage VPUMP as the first internal voltage VINT1.

As described above, the internal voltage generation circuit in accordance with an embodiment of the present invention selectively transmits the pumping voltage VPUMP pumped by the second voltage pump 324 as the first internal voltage VINT1 or the second internal voltage VINT2. That is, the internal voltage generation circuit in accordance with an embodiment of the present invention is used for generating the first internal voltage VINT1 as well as the second internal voltage VINT2 using the second voltage pump 324. Therefore, when the first internal voltage VINT1 is excessively consumed during operation of a semiconductor memory device, the first internal voltage VINT1 is pumped by using the shared second voltage pump 324 as well as the first voltage pump 313, thereby improving the pumping efficiency and reducing the layout area.

Figure 4:
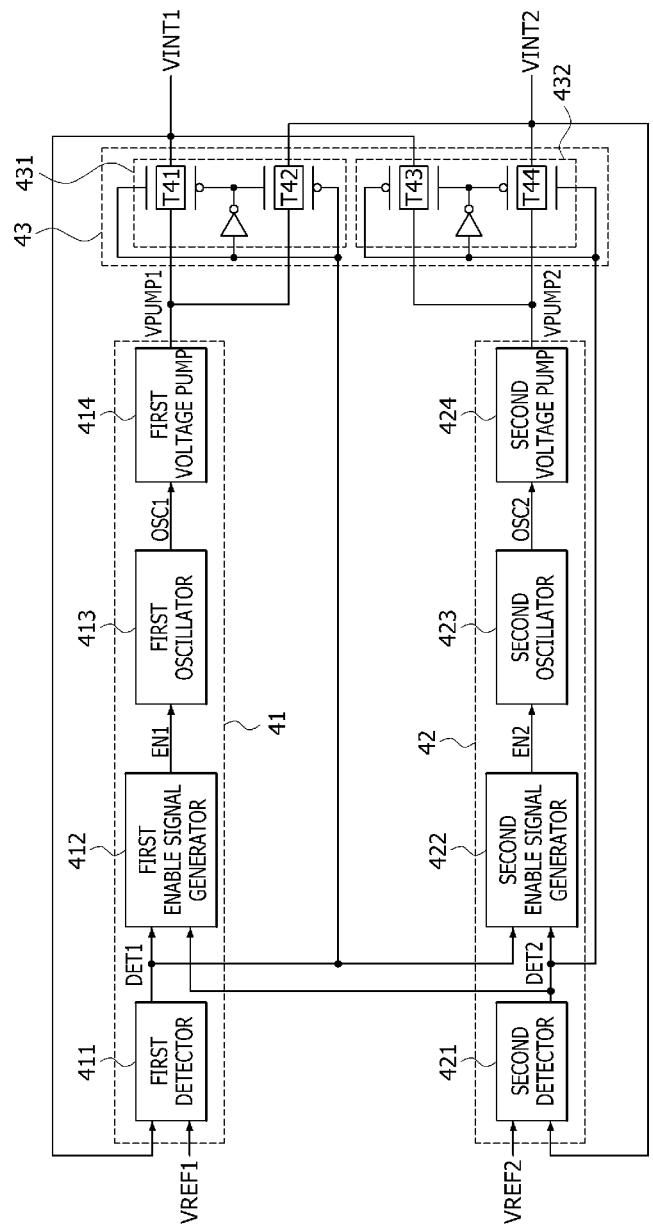
FIG. 4 illustrates a configuration of an internal voltage generation circuit in accordance with still another embodiment of the present invention.

Referring to FIG. 4, the internal voltage generation circuit in accordance with an embodiment of the present invention includes a first pumping voltage generation unit 41, a second pumping voltage generation unit 42, and a select transmission unit 43. The first pumping voltage generation unit 41 includes a first detector 411, a first enable signal generator 412, a first oscillator 413, and a first voltage pump 414. The second pumping voltage generation unit 42 includes a second detector 421, a second enable signal generator 422, a second oscillator 423, and a second voltage pump 424. The select transmission unit 43 includes a first select transmitter 431 and a second select transmitter 432. The first detector 411 is configured to generate a first detection signal DET1 which is enabled to a logic high level when a first internal voltage VINT1 has a lower level than a first reference voltage VREF1. The first enable signal generator 412 is configured to generate a first enable signal EN1 when at least one of the first detection signal DET1 and a second detection signal DET2 is enabled to a logic high level. The first oscillator 413 is configured to generate a first oscillation signal OSC1 as a periodic signal when the first enable signal EN1 is enabled to a logic high level. The first voltage pump 414 is configured to receive the first oscillation signal OSC1 and pump a first pumping voltage VPUMP1. The second detector 421 is configured to generate the second detection signal DET2 which is enabled to a logic high level when a second internal voltage VINT2 has a lower level than a second reference voltage VREF2. The second signal generator 422 is configured to generate a second enable signal EN2 when at least one of the first and second detection signals DET1 or DET2 is enabled to a logic high level. The second oscillator 423 is configured to generate a second oscillation signal OSC2 as a periodic signal when the second enable signal EN2 is enabled to a logic high level. The second voltage pump 424 is configured to receive the second oscillation signal OSC2 and pump a second pumping voltage VPUMP2. The first select transmitter 431 includes a first transmission gate T41 and a second transmission gate T42. The first select transmitter 431 is configured to transmit the first pumping voltage VPUMP1 as the first internal voltage VINT1 through the first transmission gate T41 when the first detection signal DET1 is enabled to a logic high level, and transmit the first pumping voltage VPUMP1 as the second internal voltage VINT2 through the second transmission gate T42 when the first detection signal DET1 is disabled to a logic low level. The second select transmitter 432 includes a third transmission gate T43 and a fourth transmission gate T44. The second select transmitter 432 is configured to transmit the second pumping voltage VPUMP2 as the second internal voltage VINT2 through the fourth transmission gate T44 when the second detection signal DET2 is enabled to a logic high level, and transmit the second pumping voltage VPUMP2 as the first internal voltage VINT1 through the third transmission gate T43 when the second detection signal DET2 is disabled to a logic low level.

The operation of the internal voltage generation circuit configured in such a manner may be divided into a case in which the first internal voltage VINT1 has a lower level than the first reference voltage VREF1 and a case in which the first internal voltage VINT1 has a higher level than the first reference voltage VREF1, and will be described as follows.

First, when the first internal voltage VINT1 has a lower level than the first reference voltage VREF1, the first detector 411 generates the first detection signal DET1 enabled to a logic high level. In this case, when the second internal voltage VINT2 has a higher level than the second reference voltage VREF2, the second detector 421 generates the second detection signal DET2 disabled to a logic low level. Accordingly, the first enable signal generator 412 generates the first enable signal EN1 enabled to a logic high level, the first oscillator 413 generates the first oscillation signal OSC1, the first voltage pump 414 pumps the first pumping voltage VPUMP1, and the first select transmitter 431 transmits the first pumping voltage VPUMP1 as the first internal voltage VINT1. Furthermore, because at least one of the first and second detection signals DET1 or DET2 is enabled to a logic high level, the second enable signal generator 422 generates the second enable signal EN2 enabled to a logic high level, the second oscillator 423 generates the second oscillation signal OSC2, the second voltage pump 424 pumps the second pumping voltage VPUMP2, and the second select transmitter 432 transmits the second pumping voltage VPUMP2 as the first internal voltage VINT1.

Next, when the first internal voltage has a higher level than the first reference voltage VREF1, the first detector 411 generates the first detection signal DET1 disabled to a logic low level. In this case, when the second internal voltage VINT2 has a lower level than the second reference voltage VREF2, the second detector 421 generates the second detection signal DET2 enabled to a logic high level. Accordingly, because at least one of the first and second detection signals DET1 or DET2 is enabled to a logic high level, the first enable signal generator 412 generates the first enable signal EN1 enabled to a logic high level, the first oscillator 413 generates the first oscillation signal OSC1, the first voltage pump 414 pumps the first pumping voltage VPUMP1, and the first select transmitter 431 transmits the first pumping voltage VPUMP1 as the second internal voltage VINT2. Furthermore, the second enable signal generator 422 generates the second enable signal EN2 enabled to a logic high level, the second oscillator 423 generates the second oscillation signal OSC2, the second voltage pump 424 pumps the second pumping voltage VPUMP2, and the second select transmitter 432 transmits the second pumping voltage VPUMP2 as the second internal voltage VINT2.

As described above, the internal voltage generation circuit in accordance with an embodiment of the present invention selectively transmits the first pumping voltage VPUMP1 pumped by the first voltage pump 414 as the first or second internal voltage VINT1 or VINT2. Furthermore, the internal voltage generation circuit selectively transmits the second pumping voltage VPUMP2 pumped by the second voltage pump 424 as the first or second internal voltage VINT1 or VINT2. That is, when the first internal voltage VINT1 is excessively consumed during operation of a semiconductor memory device, the shared second voltage pump 424 as well as the first voltage pump 414 may be used to pump the first internal voltage VINT1. Furthermore, when the second internal voltage VINT2 is excessively consumed during operation of the semiconductor memory device, the shared second voltage pump 424 as well as the first voltage pump 414 may be used to pump the second internal voltage VINT2. Therefore, pumping efficiency may be increased, and a voltage pump does not need to be added for each internal voltage, which makes it possible to reduce the layout area.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An internal voltage generation circuit comprising:
    an internal voltage generation unit configured to detect a level of a first internal voltage and generate the first internal voltage;
    a pumping voltage generation unit configured to generate a pumping voltage when the first internal voltage has a lower level than a first reference voltage or a second internal voltage has a lower level than a second reference voltage; and
    a select transmission unit configured to selectively transmit the pumping voltage as the first internal voltage or the second internal voltage.

2. The internal voltage generation circuit of claim 1, wherein the internal voltage generation unit generates a first detection signal which is enabled when the first internal voltage has a lower level than the first reference voltage, and generates the first internal voltage when the first detection signal is enabled.

3. The internal voltage generation circuit of claim 2, wherein the pumping voltage generation unit generates a second detection signal in response to the second internal voltage, and generates the pumping voltage when at least one of the first and second detection signals is enabled.

4. The internal voltage generation circuit of claim 3, wherein the select transmission unit transmits the pumping voltage as the second internal voltage when the second detection signal is enabled, and transmits the pumping voltage as the first internal voltage when the second detection signal is disabled.

5. The internal voltage generation circuit of claim 3, wherein the internal voltage generation unit comprises:
    a first detector configured to detect the level of the first internal voltage in response to the first reference voltage and generate the first detection signal;
    a first oscillator configured to generate a first oscillation signal in response to the first detection signal; and
    a first voltage pump configured to generate the first internal voltage in response to the first oscillation signal.

6. The internal voltage generation circuit of claim 5, wherein the pumping voltage generation unit comprises:
    a second detector configured to detect the level of the second internal voltage in response to the second reference voltage and generate the second detection signal;
    an enable signal generator configured to generate an enable signal in response to the first and second detection signals;
    a second oscillator configured to generate a second oscillation signal in response to the enable signal; and
    a second voltage pump configured to generate the pumping voltage in response to the second oscillation signal.

7. An internal voltage generation circuit comprising:
    a first pumping voltage generation unit configured to generate a first pumping voltage when a first internal voltage has a lower level than a first reference voltage or a second internal voltage has a lower level than a second reference voltage;
    a second pumping voltage generation unit configured to generate a second pumping voltage when the first internal voltage has a lower level than the first reference voltage and the second internal voltage has a lower level than the second reference voltage;
    a first select transmission unit configured to selectively transmit the first pumping voltage as the first internal voltage or the second internal voltage; and
    a second select transmission unit configured to selectively transmit the second pumping voltage as the first internal voltage or the second internal voltage.

8. The internal voltage generation circuit of claim 7, wherein the first pumping voltage generation unit receives a second detection signal, generates a first detection signal in response to the first internal voltage, and generates the first pumping voltage when at least one of the first and second detection signals is enabled.

9. The internal voltage generation circuit of claim 8, wherein the second pumping voltage generation unit receives the first detection signal, generates the second detection signal in response to the second internal voltage, and generates the second pumping voltage when at least one of the first and second detection signals is enabled.

10. The internal voltage generation circuit of claim 9, wherein the first select transmission unit transmits the first pumping voltage as the first internal voltage when the first detection signal is enabled, and transmits the first pumping voltage as the second internal voltage when the first detection signal is disabled.

11. The internal voltage generation circuit of claim 10, wherein the second select transmission unit transmits the second pumping voltage as the second internal voltage when the second detection signal is enabled, and transmits the second pumping voltage as the first internal voltage when the second detection signal is disabled.

12. The internal voltage generation circuit of claim 11, wherein the first pumping voltage generation unit comprises:
    a first detector configured to detect the level of the first internal voltage in response to the first reference voltage and generate the first detection signal;
    a first enable signal generator configured to generate a first enable signal in response to the first and second detection signals;
    a first oscillator configured to generate a first oscillation signal in response to the first enable signal; and
    a first voltage pump configured to generate the first pumping voltage in response to the first oscillation signal.

13. The internal voltage generation circuit of claim 12, wherein the second pumping voltage generation unit comprises:
    a second detector configured to detect the level of the second internal voltage in response to the second reference voltage and generate the second detection signal;
    a second enable signal generator configured to generate a second enable signal in response to the first and second detection signals;
    a second oscillator configured to generate a second oscillation signal in response to the second enable signal; and
    a second voltage pump configured to generate the second pumping voltage in response to the second oscillation signal.

14. The internal voltage generation circuit of claim 7, wherein the internal voltage generation circuit is configured to transmit the first pumping voltage as the first internal voltage when the first internal voltage has a lower level than the first reference voltage, and transmit the first pumping voltage as the second internal voltage when the first internal voltage has a higher level than the first reference voltage.

15. The internal voltage generation circuit of claim 7, wherein the internal voltage generation circuit is configured to transmit the second pumping voltage as the second internal voltage when the second internal voltage has a lower level than the second reference voltage, and transmit the second pumping voltage as the first internal voltage when the second internal voltage has a higher level than the second reference voltage.

* * * * *